(12) United States Patent
Hagenauer et al.

(10) Patent No.: US 6,851,083 B1
(45) Date of Patent: Feb. 1, 2005

(54) METHOD FOR TRANSMITTING SOURCE ENCODED DIGITAL SIGNALS

(75) Inventors: Joachim Hagenauer, Seefeld (DE); Thomas Stockhammer, Bergen (DE); Christian Weiss, Krumbach (DE); Wolfgang Denk, Haldenwang (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/869,461
(22) PCT Filed: Dec. 29, 1999
(86) PCT No.: PCT/EP99/10459

§ 371 (c)(1),
(2), (4) Date: Oct. 10, 2001

(87) PCT Pub. No.: WO00/41315

PCT Pub. Date: Jul. 13, 2000

(30) Foreign Application Priority Data

Dec. 30, 1998 (DE) .......................................... 198 60 531

(51) Int. Cl.$^7$ .............................................. H03M 13/00

(52) U.S. Cl. ...................................... 714/774; 714/776

(58) Field of Search ................................ 714/774, 776, 714/790

(56) References Cited

U.S. PATENT DOCUMENTS

| 4,797,887 A | * | 1/1989 | Yamasaki et al. | ............ 714/791 |
| 5,617,541 A | * | 4/1997 | Albanese et al. | ............ 709/207 |
| 6,307,487 B1 | * | 10/2001 | Luby | ........................... 341/50 |
| 6,490,705 B1 | * | 12/2002 | Boyce | ........................ 714/776 |

OTHER PUBLICATIONS

Cox, R.V.; Hagenauer, J.; Seshadri, N.; Sundberg, C.–E.; A sub–band coder designed for combined source and channel coding [speech coding], International Conference on Acoustics, Speech, and Signal Processing, Apr. 11–14, 1988, page(s): 235–238, vol. 1.*

Albanese, A.; Blomer, J.; Edmonds, J.; Luby, M.; Sudan, M.; Priority encoding transmission, Proceedings of the 35th Annual Symposium on Foundations on Computer Science, Nov. 20–22, 1994, page(s): 604–612.*

Albanese, A.; Blomer, J.; Edmonds, J.; Luby, M.; Sudan, M.; Priority encoding transmission, IEEE Transactions on Information Theory, vol.: 42 Issue: 6, Nov. 1996, page(s): 1737–1744.*

Shacham, N.; Multipoint communication by hierarchically encoded data, Eleventh Annual Joint Conference of the IEEE Computer and Communications Societies, May 4–8, 1992, page(s): 2107–2114 vol. 3.*

Fischer, T.R.; Qing Chen; Subband image coding for packet erasure channels, Proceedings of the International Conference on Image Processing, vol.: 1, Sep. 16–19, 1996, pp(s): 589–592.*

(List continued on next page.)

Primary Examiner—Joseph D. Torres

(57) ABSTRACT

A method of transmitting encoded digital signals and decoding the digital signals at a receiver. During source encoding, the signals are divided into a plurality of subunits. Each subunit is assigned one of a plurality of differing levels of significance. The subunits are hierarchically ordered in a data frame according to their levels of significance. The subunits are then channel encoded utilizing a variable rate code. The rate increases for increasing levels of significance. At the receiver decoder, a subset of the subunits are correctly decoded to produce a correct portion of decoded data. The correct portion is defined by a position of a first error in the data frame. The position of the first error in the data frame is dependent upon at least one of the encoding rate, channel quality, and decoding complexity. The digital signals are then reconstructed using only the correct portion of decoded data.

29 Claims, 3 Drawing Sheets

OTHER PUBLICATIONS

Figure 1:
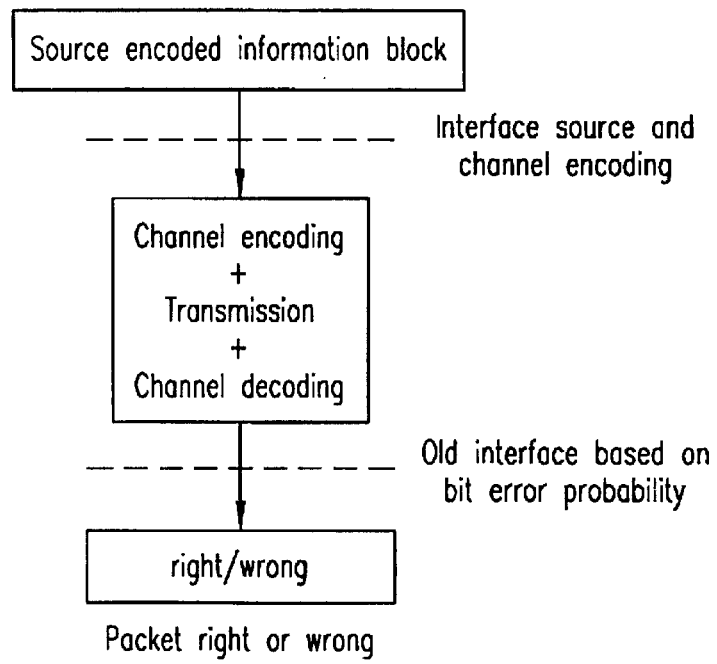

Seeger, A., "Information Theoretical Based Design of Hierarchical Channel Coding and Modulation for Mobile Radio Channels," Signal Processing: Image Communication, vol. 12, Apr. 1998; pp. 117–125.

Berrou, C. et al; "Digital Television: Hierarchical Channel Coding Using Turbo–Codes," International Conference on Communications (ICC), US, New York, IEEE, May 1, 1994; pp.; 1255–1259.

Hagenauer, J., "Rate–Compatible Punctured Convolutional Codes (RCPC Codes) and Their Applications," IEEE Transactions on Communications, vol. 36, No. 4, Apr. 1988, pp. 389–400.

Hoeher, P. et al., "Performance of an RCPC–Coded OFDM–based Digital Audio Broadcasting (DAB) System," IEEE Global Telecommunications Conference Globecom '91, Dec. 2, 1991, pp. 0040–0046.

Hoeher, P., "Unequal Error Protection for Digital Mobile DS–CDMA Radio Systems," IEEE, May 1, 1994, pp. 1236–1241; XP 000438698.

Schleger, C., "Trellis Coding," Chapter 6, Decoding Strategies, Jun. 1997, IEEE Press, pp. 153–191; XP–002137976.

International Search Report; International Application No. PCT/EP99/10459; May 18, 2000, pp. 1–2.

* cited by examiner

METHOD FOR TRANSMITTING SOURCE ENCODED DIGITAL SIGNALS

TECHNICAL DOMAIN

The invention relates to a method for transmitting source encoded digital signals that may be allocated different significance values by bits, by symbols or in groups, within data frames via one channel.

PRIOR ART

The domains of application of the method to which the invention refers are generally the transmission or storage of digitally coded signals on channels on which errors occur. Examples of such signals are, among others, speech, text, sound, images, video or measurement signals. In what follows a channel refers to any conceivable form of transmission medium, storage medium or combination of these media.

Examples of transmission media are, on one hand, the air interface for a transmission not through wires, as exemplified by mobile or radio broadcasting, as well as "radio in the local loop" systems (wireless subscriber connection to cover the last mile). On the other hand, the concept of transmission media also includes every conceivable type of wire-dependent system that cannot guarantee flawless transmission. As examples, mention may be made of protocol-related packet losses in the case of IP (Internet Protocol) or ATM (Asynchronous Transfer Mode) with packet losses being able to occur even in the event of transmission through glass-fibre wires. Such types of packet loss may occur, for example, through buffer overflow or a violation of a maximum delay requirement. Mention will be made here only of optical, magnetic or magneto-optical recording of digital data as representative of storage media.

In transmission technology, there is generally one relevant interface, namely that between the source and channel encoding. There are many reasons behind the selection of this interface between source and channel encoding. On one hand, the theory of information indicates that under determined conditions, this interface is simple and important. Ideally, binary data are optimally produced with the help of source encoding processes and can then be transmitted optimally through channel encoding and subsequent processing steps. On the other hand, this interface provides the linkage between the application area, which is autonomous, and the transmission systems area, which is also autonomous.

Both in terms of standardisation and in terms of implementation, this interface is ideally suited to delimit different tasks. This interface, however, generally does not define the transmission format in any way. Therefore, an additional distinction between packet-oriented and connection-oriented transmission may be made, in that with packet-oriented transmission, the integrity of the packet boundaries must be guaranteed while connection-oriented transmission is based on a continuous stream of bits.

This flexible and, at the same time, universal property of digital transmission systems is a primary reason for their success. Incorporation into this type of system of new applications and services, the underlying data of which are encoded in binary form, is easy and cost-effective. In the following, applications will be taken to mean signals converted by source encoding procedures into a format that is appropriate for transmission or storage. Applications and services are made accessible to transmission by the simple fact that the data underlying them display the required transmission format, i.e. the data must, for example, be encoded in binary form.

However, there are limitations with this simple interface, if any and all transmission media and applications are to be combined. The surrounding physical conditions mean that many channels demonstrate transmission quality that varies over time and/or by location, which means that the required minimum quality for the transmission medium cannot be guaranteed, and information may be lost or may reach the receiver garbled. For many applications that allow only a certain stipulated delay or do not permit the channel coding system to operate on a worst-case scenario, this interface can no longer be viewed as ideal. It is true that in certain cases it is possible for the lost information to be transmitted repeatedly, in response to requests to repeat, until it is correctly received by the receiver. However, requests for delays, the absence of a return channel or inadequate storage capacity often prevent repetition of the information. This leads to a requirement for robust source encoding processes to avoid the degradation or even failure of the application.

The following will give a brief overview of some transmission or storage media that may be subject to the disturbances described above.

In mobile broadcasting, a change in quality by location and/or over time is unavoidable, due to the distance from the base station, environmental factors and motion (leading to fading). While it would be possible to have a return channel, this would create an unacceptable delay for most applications; in addition, the rate of data or the throughput would decrease.

Likewise, in radio broadcasting, a change in quality by location is unavoidable due to distance from the broadcasting antenna and environmental factors. If the receiver is mobile, there is also a change over time due to change of environment and motion (Doppler effect, signal scatter, fading). In this context, radio broadcasting not only designates traditional radio but also includes paging systems and all types of unidirectional radio services.

In addition to mobile broadcasting and radio broadcasting, there are also non-wire-bound, bi-directional radio-based systems that, while they display no mobility, nonetheless use the air interface for transmission. Examples include, among others, wireless local loop systems, wireless local area networks, etc.

Furthermore, there are also so-called portable systems that may be classified between stationary non-wire-bound systems and the mobile radio. Except for the disturbances caused by mobility, these systems are also subject to the same disturbance factors as, for example, mobile broadcasting systems. While the receiver is indeed immobile, every receiver receives signals from the transmission station through a different channel, which means that the conditions cannot be optimised simultaneously for all participants.

On the Internet, heterogeneous networks, blocking and limited storage capacity or buffers result in extensive delays and packet losses that can fluctuate widely depending on the load on the network at different times. Basically, repeat-transmission procedures (requests to repeat via return channels) are used, but these often lead to unacceptable delays for many real-time applications (for example, Internet telephony).

Packet delays and losses may also occur in ATM networks due to blocking, storage limitations, buffer limitations and heterogeneous transmission media. Furthermore, here also, repeat transmission (requests to repeat via a return channel) is unacceptable due to the delays which it entails.

Similar degradation is also possible in other networks and transmission media. Examples of such networks and media are satellite broadcasting, point-to-point radio systems, modem transmissions, satellite mobile broadcasting, etc.

Additionally, consistently high quality in the storage of digital data can often not be guaranteed, due to the structure of the storage medium (faulty storage areas, fading of magnetisation, leakage currents in the case of semiconductor storage, wear and tear). Here, a distinction must be made between location-related faults (material faults) and potentials for time-related faults, in which the long-term behaviour also plays an important role.

The following outlines the signals that are digitised for transmission. Frequently, such signals entail considerable redundancy owing to their correlation properties. These redundancies are largely removed through source-encoding algorithms. However, this means that streams of bits encoded in binary form are considerably more prone to the transmission errors described above.

Speech is most often implemented in a bi-directional link for communication purposes. Therefore, the maximum delay times are severely limited, and repeat transmissions are usually not possible. In general, speech signals entail much redundancy and psycho-acoustical irrelevance. While much of the redundancy can be removed through source encoding, this in turn makes the system more prone to errors. The same holds true for audio signals. If the signals are transmitted by radio, repeating packets is not possible.

Pictures usually contain a great deal of redundancy, relating to their correlations in space. After encoding, they are virtually free of redundancy, but they cannot be reconstructed in the event of transmission errors. With video images, in addition to the correlations in space there are also correlations in time. In a sequence of images, individual images are predicted from those preceding. If an error occurs, it generally persists, on the basis of erroneous prediction.

Additional signals, which are encoded in a manner which will not be discussed here, such as text, measurement signals, etc., can also be very error-prone due to high levels of compression.

Consequently the method in accordance with the invention is applicable in many domains, combinations and variants. Firstly, each signal can be transmitted via each individual medium. Secondly, each individual signal can be transmitted via heterogeneous media. Thirdly, encoded signals can be combined (multimedia) and transmitted over individual or heterogeneous network structures.

Up to the present, the transmission of signals via the channels already described has been resolved in such a manner as to minimise the probability of bit error, packet error or packet loss on the channel. This occurs through the implementation of channel encoding; however, a certain part of the available bandwidth must thereby be used for this intentionally implemented redundancy.

However, the dimensioning of the channel encoding rate is only optimised for one defined channel condition. If the channel condition changes as a result of the fluctuations in quality already described, then this optimum matching is no longer provided. At too low a code rate (code rate=infobits/ infobits+redundancy bits), i.e. with too much redundancy, too great a proportion is used up for the redundancy; but the quality could be considerably improved by the allocation of more bits for the source encoding of the application. In cases of too little redundancy, bit and packet errors may arise; in such cases, the application often severely degrades or fails completely.

Furthermore, for applications in which data are to be transmitted via the above-mentioned channels, demands are placed on the channel encoding.

For example, for many low-redundancy and low-irrelevancy encoded applications for certain absolutely essential information purposes in the bit stream, perfectly flawless transmission has to be provided. Examples of this are mode bits, Huffman tables, the start of a block encoded with variable length codes (VLC), or length information, such as number of symbols, block length etc., which is often a minimum prerequisite for the operability of signal processing algorithms, as for example in source encoding.

In order to solve the previously described problems and to fulfill the ensuing requirements, several potential solutions are known from the prior art which can be implemented in the encoding process.

For error-proof source encoding, information must be encoded such that acceptable quality of decoding is still preserved in cases of bit error or packet loss. The quality is then often dependent on the complexity of the decoding (for example, error recognition measures, selection of channel codes of varying complexity). A concomitant disadvantage, however, is the loss in terms of compression efficiency. In addition, such procedures always entail major losses in quality in the event that the channel severely degrades.

The problems described above can be eliminated by dynamically tuning the rate of channel encoding to the channel quality. However, several prerequisites are indispensable for the use of such mechanisms. In particular, the channel condition must be known to the sender before the encoding takes place. This means that the channel must not change too quickly, and a return channel must be available. If a sender is dealing with more than one receiver, this scenario is impossible.

All procedures which provide for adaptation of the channel encoding to the source code or for a procedure for common source and channel encoding, are always designed very specifically for the application and tuned to the channel. There is thus no possibility for a uniform interface. Additionally, such procedures are, as a rule, very complex.

By means of a division of applications into different hierarchical levels and an uneven error protection system, levels of differing significance can be decoded in accordance with the channel quality at that particular moment. Usually, however, such receivers are very complex, as every layer must be specifically decoded. Furthermore, there are usually few layers, often no more than two, and in consequence the different conditions are allowed for only to a limited extent. In addition, an effective error detection system is necessary for the upper hierarchical layers. Owing to the low number of layers, robustly error-proof coding is normally also necessary at the so-called base layer, in order to offer sufficient protection against errors during the decoding process.

A method is known both from A. Seeger: "Information theoretical based design of hierarchical channel coding and modification for mobile radio channels" in Signal Process Image Communication, Vol. 12, April 1998 (1998 April), pp. 117–125, XP004121503, and from C. Berrou and Combelles: "Digital Television: Hierarchical Channel Coding using Turbo-Codes" in International Conference on Communications (ICC), US, New York, IEEE, 1 May 1994 (1994 May 01), pp. 1255–1259, XP000438701 for transmitting source-encoded signals to which differing levels of significance are assigned in groups and which are then subsequently transmitted in data frames through the channel. In this process, there is a division at the transmitting end into information subunits of varying levels of significance, i.e. into hierarchical classes. On the receiving end in this known method, a selection is made from of the hierarchically arranged data as a function of the channel quality at that given moment (so-called "graceful degradation").

On the transmitting end following the hierarchical source encoding, through which the greater part of the available redundancy is assigned to the video data of higher priority, and thus of greater significance, and the other part is assigned to the remainder, in other words the relatively insignificant video information component, there is on the one hand channel encoding for the higher-priority source encoded video data and on the other hand channel encoding for the relatively insignificant source encoded video data, thus for the lower-priority video data. In this process, low-rate codes are used for the channel encoding of the higher-priority video data, with the Euclidean space between the selected clusters being relatively large, and high-rate codes are used for the encoding of the lower-priority video data, with the Euclidean space between the selected points being relatively small. On the receiving end, in this known method, from the video data mix transmitted in overlaid form, a cluster is first detected for the higher-priority video data by a channel decoder. If the channel conditions are suitable, then a channel decoder selects the chosen point for the lower-priority video data, making use of the decision with respect to the cluster. A hierarchical source decoder then decodes either the most significant video data or combines both data streams into complete video information, if this is permitted by the properties of the channel. It should be noted that for both of these known methods, two different channel codes are used: one with a low code rate for video data belonging to the higher hierarchical levels (higher priority and significance), and the other with a high code rate for video data belonging to the lower hierarchical levels (lower priority and significance).

From J. Hagenauer: "Rate-Compatible Punctured Convolutional Codes (RCPC Codes) and their Applications" in IEEE Transactions on Communications, Vol. 36, No. 4, April 1988 (1988 April), pp. 389–400×P002137975, RCPC error protection codes are known, in which the code rate may be changed within a single data frame and during transmission in accordance with requirements. Information regarding the significance of the source signal, information regarding the condition of the channel and check information from the decoded bits can be used for the adaptation of the coding and decoding algorithm of the RCPC code. With regard to a dynamic tuning of the channel coding rate to the channel quality, however, it is thus an essential requirement that the channel condition is known to the transmitter. Thus, the channel must not change too quickly. In addition, a return channel must be provided for transmission of the prevailing channel conditions at each time.

Frequently, automatic repeat requests (ARQs) are implemented in the event of packet losses on channels with errors. Two extremely restrictive requirements must be satisfied for this. On the one hand, the repeat request must not exceed the maximum delay required by the application; on the other hand, a bi-directional connection must be established. Additional signalling overhead and capacious storage space at the transmitting end are further restrictive factors.

Such procedures can be improved in the decoding process by making use of not fully eliminated redundancies in the decoding, to generate a priori knowledge or for purposes of error concealment. However, such algorithms are always implemented only at the decoding end and have nothing to do with the encoding process as such. Furthermore, combinations of the measures described above may be possible; however, here too the problems already described occur.

In principle, all procedures already known always pursue a minimisation of the bit error rate or the packet loss probability at the decoder interface. Furthermore, transmitted packets are lost completely or the bit errors are evenly distributed within a hierarchical level. Even when there are several hierarchical levels, it is attempted to achieve minimisation of the error rate within one level. However, data are often useless following an error, since they cannot be interpreted, due to missing information. In addition, the losses in terms of quality are often far larger if information is incorrectly decoded, since misinterpretation of the subsequent information then often results.

In EP 0 798 888 a process is described that is closely related to GSM and has to do, among other things, with a special function, namely an improved "bad frame indication," for GSM. For this purpose, data are organised into a plan of hierarchical levels. Over each of these hierarchical levels, a second code or a similar measure is implemented for error detection, with only the known possibility of the CRC being mentioned. This code or this measure then serves to determine whether transmission has been successful or erroneous, including correction of the respective hierarchical class. The information about the correct or erroneous decoding of certain classes is then used to determine a quality measure, which is used for an improved bad frame indication. By means of the improved bad frame indication, improved speech quality is then achieved by suitable measures, as for example through error concealment.

With this procedure it is possible to make only one division into a small number of hierarchical classes, since otherwise the efficiency of the procedure is lost owing to the overhead created for the error detection purposes. Error detection always requires a second code, such as a CRC, which limits efficiency and thus also restricts the hierarchical levels to a low number. Additionally, only one error detection operation is possible with this known procedure. Furthermore, the interpretation and the quality attainable for all receivers are determined by the weakest receiver. In addition, the procedure in accordance with EP 0 798 888 is subject to limitations due to the rate loss which results, for example, from the CRC codes, the stationary condition of the return channel, etc.

JP 9-23 214 A describes a procedure that is always dependent on a so-called header, which is used for the determination of the error rate at any given moment (error rate discriminator) on the basis of a test pattern. The procedure in accordance with JP 9-23 214 A is usable only for a small number of classes, since headers must be generated and transmitted for each class. Moreover, the decoding of a class is possible only if the entire related header is correctly decoded.

Furthermore, with this known procedure, the hierarchical classes always have a fixed block size, and the relation between information and checksum must be encoded and transmitted in a header. For example, if the header cannot be decoded correctly, nothing can be done with the class as a whole, even if its length is known.

Also with this known procedure, operation has to be attuned explicitly to the worst case. The attainable quality is thus defined by the worst case; this means that through the limited number of classes actually possible, the potential for progression is also limited. Therefore, improvement is possible only in a few gradations. The number of the gradations is, however, stipulated by the number of hierarchical levels.

With this known procedure, a second method is always necessary in order to determine the correctness of the data, whether by means of a test pattern for the error rate discriminator, an error detection code or similar measures. With the procedure in accordance with JP 9-23 214 A, an error rate discriminator is essentially used in conjunction with the test pattern in order to determine the error rate on the channel during the transmission of the test pattern and to control the selection of the hierarchical data on the basis of the determined error rate. The error rate during the transmission, however, does not state deterministically whether the data of the appropriate hierarchical class are flawless, but only gives an indication, through statistical observations, on the error rate that may be anticipated for this hierarchical class.

Even the headers, which contain only information about class boundaries and the related channel encoding rate, are protected with a channel code with high redundancy, since the correct decoding of these headers is an indispensable prerequisite for the applicability of the procedure outlined in the publication of JP 9-23-214 A. In the case of a different composition of the receiver's qualities, the determination of the error protection for the individual classes and their boundaries must once again be repeated, from which it follows that with this known procedure there is no adaptivity.

DESCRIPTION OF THE INVENTION

The task of the invention is therefore to provide a qualitatively improved method for the transmission or storage of encoded signals on channels with errors and to define an essentially new interface.

In accordance with the invention, which refers to a method for the transmission of source-encoded digital signals, to which may be allocated varying significance levels by bits, by symbols or in groups, within data frames via one channel, where at the transmitting end during the source encoding which takes place before channel encoding, there is for each data frame a division of an overall quantity of information into as many information subunits of varying significance as are desired, in other words into so-called hierarchical classes, by bits, by symbols, or in groups, and on the receiving end, as a function of the channel quality at a given moment, a selection is made from the hierarchical data available, this task is executed by the feature that the source-encoded data stream is channel encoded with a single code allowing both for error detection and location and for error correction such that on the receiving end, after a channel decoding for every received data frame, a subset of the information subunits, this subset being dependent on the quality of the channel at a given moment and/or the decoding complexity provided and/or the receiver complexity available, can be correctly decoded, and that the correct portion of the decoded data can be determined from the characteristics of the decoding procedure of the error correction code, so that for the reconstruction of the source signal, only the correctly decoded subset of the transmitted information subunits is used and passed on to the application.

The invention is generally applicable to any signal to which the quality weighting of the data as described above is applicable.

With the method according to the invention, it is particularly advantageous that for every conceivable combination of signals to be transmitted and for every conceivable combination of channels, a method is provided which adapts itself to the channel condition of the given moment, and thus, in accordance with that channel condition, makes possible reception of a certain quality, with a simple interface between source encoding and channel encoding being ensured.

Additional advantageous and expedient embodiments of the method in accordance with the invention, as well as particularly advantageous potential applications of this method, are described in the claims which directly or indirectly refer back to claim 1.

SUMMARY DESCRIPTION OF THE FIGURES

Figure 2:
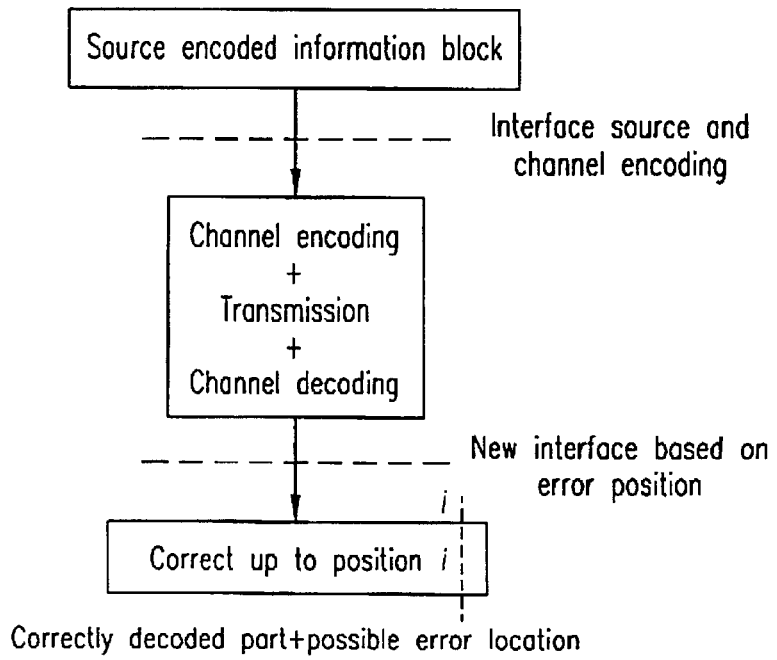
Figure 3:
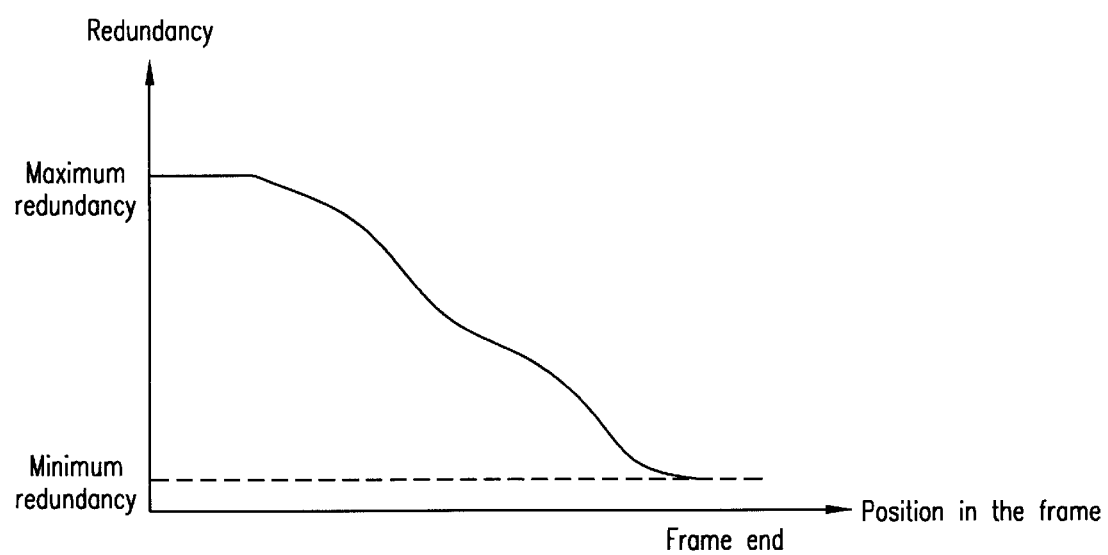
Figure 4:
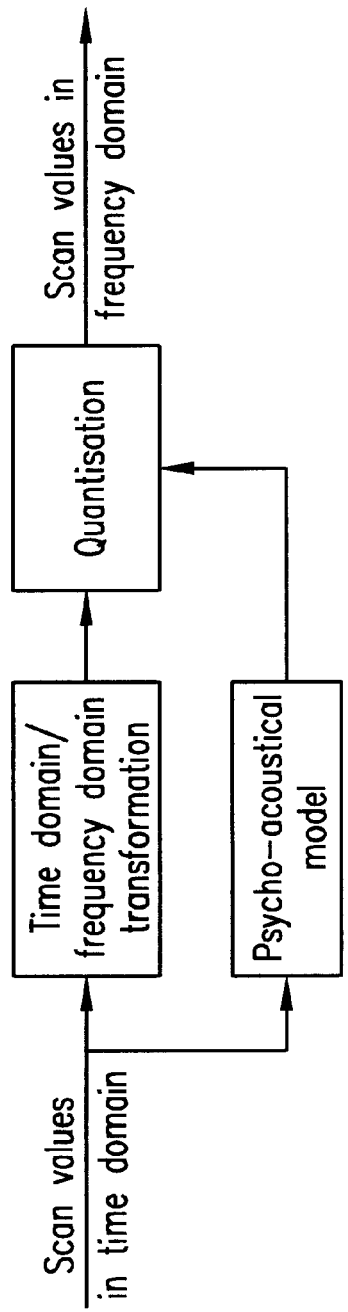
Figure 5:
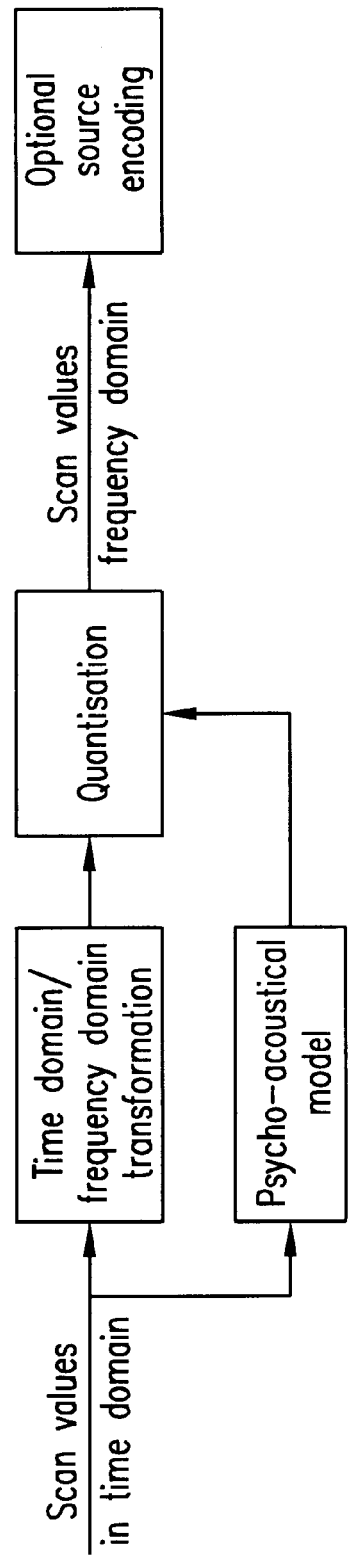

The method in accordance with the invention and sample applications of it are explained in greater detail in the following. In addition to the text, five figures are presented. These show:

FIG. 1 A block diagram of the interface customary in the past between source and channel encoding;

FIG. 2 By comparison with the above, a block diagram of an interface between source and channel encoding implemented in accordance with the invention;

FIG. 3 A possible redundancy profile for coding unbalanced data;

FIG. 4 As an example, for a mobile audio transmission, a block diagram which illustrates the principles of the procedure for creating a compressed data signal for transmission, from a sampled audio time-domain signal based on psycho-acoustical considerations;

FIG. 5 As an example, for a mobile audio broadcast, a block diagram which illustrates the principles of the procedure for creating a doubly compressed data signal for transmission, from a sampled audio time-domain signal based on psycho-acoustical considerations;

EMBODIMENTS OF THE INVENTION

As shown in FIG. 2, in accordance with the invention an interface between source and channel encoding is defined which contrasts with those used up to the present, described above and represented in FIG. 1. Thereby, bit packets do not become completely lost and bit errors are not randomly distributed. This means that a subset of the information, the size of this subset being determined by the channel quality of the given moment and/or the decoding complexity, is passed on to the application, and this part may be assumed to be correct.

In accordance with the invention provision is made for an encoding which permits a receiver to decode a subset of information, the size of which will vary with the channel quality and/or the decoding complexity. The decoding complexity can thus be scaled, and a fluid tuning to the condition of the channel is thereby made possible.

The quality on the receiving end can in the most general case be improved by every additionally available information subunit, however small. The smallest possible information subunit is one bit. The application's encoding operation is ordered in accordance with the significance of the information subunits for the application's decoding operation.

This significance will be referred to in the following as Source Significance Information, SSI. Thus, for every complete information block the application's decoder is informed at the interface of the receiver how many of the most significant information subunits were successfully decoded for this complete block.

By contrast with the known methods, with the method in accordance with the invention it is possible to guarantee transmission to many receivers having differing channel quality, with each individual receiver receiving flawless individual information on an individually varying scale, in accordance with the particular conditions of that receiver (channel quality, decoding complexity, etc.). In addition, the reception quality is very accurately tuned to the channel quality. Provided that the encoding is implemented in such a way that even in the worst reception conditions it is possible to decode some basic information, the entire spectrum of receivers is covered.

Thus the main design criterion is no longer minimisation of the packet loss rate, the packet error probability or the bit error probability, but in accordance with the invention it is instead the absence of flaws from the largest possible portion of the information subunits which are most significant for the source encoding.

The objective of the source encoding now consists also (as in the case of methods from the past) in the best possible compression simultaneously with the division of the information into as many as possible subunits of differing significance levels, most preferably into individual bits. The interface remains simple and the tasks can once again be treated separately, in standardisation, in information theory and in implementation, but now in line with the inventive principle.

For example, the ordering within a single complete information block can be arranged in such a way that the information subunits having the greatest Source Significance Information are at the beginning and the information subunits of decreasing SSI are more towards the end. If, for example, the interpretation of an information subunit is dependent on the correctness of another information subunit, the dependent subunit should be moved at the encoding stage further towards the end of the block. In the method in accordance with the invention, the error protection is then designed in such way that the position (in FIG. 2, this is position i) of the first error in the transmission block is positioned as far back as possible.

This can be advantageously achieved, for example, by using codes of variable rates, with the rates increasing along the length of the block up to a maximum (lowest redundancy). Examples for codes with varying rates are punctured convolutional codes, in particular rate-compatible ones. For decoding purposes, an adaptive sequential decoder of ? given complexity (decoding resource) can be used, which then decodes as far as a certain frame depth. The source signal is reconstructed from these flawless data. With good channels, the decoding resource is not totally used up and the source is completely reconstructed. If the channel degrades, then the decoding resource will be totally used up before the end of the frame. The flawless portion of the frame can be determined from where the decoder stops in the frame, or from some other suitable location criteria (consumption of the decoding resource, changes in metrics, etc.). There is then a partial reconstruction of the source with this flawless portion of the data frame, with a slightly reduced quality.

The method in accordance with the invention can be further improved by the used of source-controlled channel encoding, channel decoding and iterative decoding.

In the following, some advantageous sample embodiments of the method in accordance with the invention are explained.

The method in accordance with the invention can be used advantageously for transmission of JPEG still images (Joint Photographic Experts Group; Standard for Compression of Still Images).

In connection with this sample embodiment, information is given below on various modes of the JPEG still image compression standard and a possible simple enhancement is described which excellently utilises the new interface already described. JPEG is based on a DCT-based (discrete cosine transform) encoding of a sequence of 8×8 pixel blocks, which contain only information on grey level. Colour images consist essentially of three independent grey-scale images, from which they can be composed. Thus the JPEG encoding of images corresponds to the encoding of three grey-scales and thus to the encoding of 8×8 pixel blocks, which in the following will be referred to as blocks, for brevity.

Each one of these blocks is transformed by a DCT into 64 orthogonal base signals. The totality of the resulting 64 DCT coefficients describes the local spectrum. This transformation is loss-free; the image can be reconstructed from the local spectrum. Additionally, a distinction is made between DC and AC. The DC describes the identical portion of the block to be encoded, the AC describes the varying coefficients of higher frequency.

In the baseline mode, there is now a quantisation of the coefficients which is tuned to the psycho-optical characteristics of the human eye. This quantisation now causes the encoding to be lossy, but the data rate is enormously compressed. By means of a run length encoding and Huffman encoding the remaining redundancies are eliminated from the quantised coefficients. Depending on its local frequencies, however, each block is represented by a different number of bits. These blocks are now aligned sequentially and transmitted.

At the beginning of the image, additional control information is inserted, such as the size of the image, the Huffman tables and quantisers used, or other specific information. If a transmission error occurs, because of the Huffman and run length encoding the image is normally completely destroyed, the remaining bits are useless and cannot be correctly assigned owing to the lack of interpretation. If the transmission error is not detected, then erroneous interpretation causes the data following the decoding error to create artefacts which often diminish the quality of the image to an unacceptable degree.

By the introduction of regular synchronisation markers, which have also encoded the current location in the image following a sequence which otherwise does not occur in the bitstream (17×0 bits), it is then possible after transmission errors at least to continue decoding at this point, which is now known. A low number of synchronisation markers, however, will barely increase the resistance to errors; a large number of markers (for example after every block) will drastically increase overhead, since the unambiguous sequence of bits and re-synchronisation information have to be encoded also. In addition, erroneous data are often represented, which severely impairs the quality.

In a further mode, JPEG offers the possibility of hierarchical encoding. Here, the original image is sub-sampled down in both dimensions in multiples of 2. The images of reduced size are then encoded with the method described earlier (DCT, quantisation and entropy encoding) and then enlarged again. This image of low resolution is now used as a basis for prediction. A differential image relative to the next size is created and this differential image is again encoded by the method of the baseline mode. This can be repeated several times.

The levels of differing resolution are now transmitted sequentially, in accordance with their significance. This results in a rough determination of significance, with the number of resolution layers being normally kept relatively small. While the compression efficiency does go down, it remains within a tolerable range. The number of bits once again varies widely within the levels.

In a further mode, JPEG permits progressive encoding. DCT and quantisation are used in the same manner as with the baseline mode. However, the individual image components are then not sequenced in one single pass, but in several. In the first pass, only the encoding of the low-frequency coefficients is performed, or perhaps also only that of the most significant bits of these PCM-encoded coefficients.

In further passes, there is further refinement, until a quality corresponding to the image quality given by the quantisation is achieved. The overall efficiency is poor (low compression), however, owing to a lack of redundancy encoding (Huffman and run length encoding). In addition, the receiver needs a storage facility for the complete image in quantised DCT representation.

With transmission in the wireless area generally being data frame-based, and with the receiver essentially needing to perform synchronisation to these frames for correct channel evaluation and decoding (synchronous reception), it can generally be assumed that the packet boundaries will be integral. The size of such packets varies from a few hundred bits (for example, 114 bits with GSM) up to several thousand (for example, 1504 bits with DVB). Generally, these packets can be utilised for transmission, and bundling of packets is also possible, in order to make larger packets available to the application (for example, with GSM: 4×114=456 bits).

These packets are now used to transmit an information frame protected by channel encoding. In the past, it has been attempted to minimise the packet loss rates, packet error probability or bit error probability, which, however, does not prove to be optimal, owing to the disadvantages already described, notably if the channel is subject to fluctuations in time and/or in location.

The transmission channel can now consist of any conceivable channel which generates bit errors or erasures. Examples are packet losses on the Internet which are widened by means of interleaving into individual erasures, the radio channel, the mobile radio channel and many others.

The packets made available by the transmission system are now used for source-encoded information and for the channel encoding redundancy. Generally, redundancy is distributed evenly over an information packet, so that bit errors may appear at random equally distributed anywhere in the source encoded information packet. In this connection, reference is made to FIG. 1.

Using the JPEG example, this will now be explained in greater detail. In order to make clearer the representation of a process over time, a motion JPEG is taken as the starting point, in other words a sequence of individual images is sent, so that one may refer to video. In the JPEG baseline mode, the encoded bitstream is distributed into corresponding frames and transmitted. If a bit error occurs in any transmission frame, the rest of the image is generally lost, since it is no longer possible to assign the remainder of the data, because of the variable length encoding. In the case of a sequence of images, it is generally possible only to re-synchronise onto the next image and to decode that after searching for a start code. Source encoding of such frames results in catastrophic quality.

By using unambiguous re-synchronisation markers after a defined number of blocks, decoding can be re-started more quickly. However, after an erroneous transmission frame, the blocks are lost until the next marker. One marker per block will cause a disproportionate increase in overhead, and in any event erroneous blocks will still be lost. In JPEG there are no explicit mechanisms, such as, for example, CRCs (cyclical redundancy checks) for error detection and, in particular, no error location.

While errors are in fact frequently detected by invalid code words or incorrectly set re-synchronisation markers, however error detection normally takes place only at a later point in the bitstream. Thus error location is not possible, and in order to avoid erroneous representation, all of the data between two re-synchronisation markers must be discarded. In order to avoid erroneous representation, and the resultant dips in quality, however, advantage can be gained from error detection by the transmission system on the channel encoding end; however, the complete transmission frame is then lost to the application.

A suitable channel encoding can be implemented in various ways. Highly suitable for the greatest variety of applications is a redundancy profile in accordance with FIG. 3, in other words one with redundancy which decreases from the beginning of the frame to the end. Encoding with punctured convolutional codes with a small memory and Viterbi decoding is relatively highly suitable for a frame encoded in that way. In addition, however, CRCs have to be injected into the bitstream for purposes of error detection, in order to allow location of the decoding error.

More suitable, with the same redundancy profile, the same bandwidth requirement and the same decoding complexity, however, is a convolutional code with a large memory and sequential decoding, for example using the stack or Fano algorithm. With this method, error location in the decoder is possible on the basis of the characteristics of the decoder: error location by means of CRCs is unnecessary. In addition, location with a degree of precision of one bit is possible, by contrast with the injected CRC, which is able only to declare a complete block right or wrong. In this connection, reference is made to FIG. 2.

In consequence it can then also happen that the most significant information, for example, is located in the middle of the transmission frame, owing to the lack of tuning to the transmission frame format.

Taking these explanations as a starting point, in the following a transmission frame of length N is defined. After transmission, a method designed in accordance with the descriptions above gives back a partial frame of length $T_i \leq N$, which can be regarded as being flawless. The length $T_i$ is dependent on the channel condition at the given moment, under which the transmission of the complete frame i takes place, and on the decoding complexity of that moment. The method in accordance with the invention defines in the transmission system an interface as described, the application should appropriately perform a corresponding encoding.

In the case of the hierarchical JPEG encoding, the ordering of the significance is generally not tuned to the frame format. The hierarchically encoded levels follow sequentially in the bitstream, arranged as a function of their significance, first the binary representation of the base level and then the other levels. In consequence similar problems as in the baseline mode can occur if transmission errors occur, above all in the level of lowest resolution, from which the following levels make predictions.

In the progressive mode, the encoding is also done in the bitstream as a function of significance, but now each individual bit can bring an increase in quality. These types of encoding are suitable for the inventive method of source and channel encoding. However, there is no tuning to the frame format of the transmission.

Additionally, to date no error protection is known which can deal with transmission conditions varying over time or in space in such a manner that for every channel condition the location of the first error can be pushed as far as possible towards the end of the frame and can also be located for every reception condition.

By means of re-arrangement into the format of the transmission frame, with the most significant levels or bits always being placed at the beginning of the frame, it would be possible to have a gradation both in the hierarchical and in the progressive encoding. With hierarchical encoding, however, there is now only a discrete gradation in levels (normally two); with progressive encoding every bit within a frame can bring additional information.

However, in the event of loss of an item of information necessary for progressive decoding, in an earlier frame, decoding in a later frame is no longer fully possible. The additional information can no longer be fully utilised. With these described types of encoding an increased amount of storage is also needed in the receiver, since for complete processing the entire image has to be stored.

It is thus necessary to find a source encoding having a significance which decreases from the beginning to the end of the frame. Additionally, there must be no dependence between the data that are transmitted in different frames, if the information from which subsequent data frames make predictions cannot be guaranteed to be correctly decoded even under poor reception conditions. This absolutely necessary information should be kept relatively small in order to make possible as granular a gradation of the source information as possible.

Thus, an encoding based on the JPEG baseline mode is considered. Each one of the individual pixel blocks j is present in encoded form, with the Huffman tables being known both for the differentially encoded DC and also for the AC which is run length encoded as events. In the following, an event is the occurrence of a non-zero coefficient in the local spectrum; amplitude, number of zero coefficients before this coefficient and a flag which indicates whether this was the last coefficient in a block are grouped together in a code.

The individual coefficients are run length and Huffman encoded. The DC between the individual blocks of a transmission frame is differentially encoded, which additionally reduces the bit rate. On the basis of these data, a tuning to the frame format of the transmission will now be explained. It is assumed that the frame length N of the transmission system is known to the encoder. The procedure for packing the blocks with a weighting into the frame format and then correspondingly decoding them again is described in the following.

1. It is assumed that all blocks up to block $J_i-1$ have already being transmitted in the preceding i-1 frames, i.e. the next block to be transmitted is $J_i$. $J_i$ is thus the cumulative number of the JPEG blocks up to the transmission frame i. For this block $J_i$ the differential encoding of the DC is reversed, and re-encoded.
2. As many encoded blocks $A_i = J_{i+1} - J_i$ as possible are packed into a transmission frame i of constant length $N_i = N$. The number of blocks $A_i$ in this frame i depends on the length $L_j$ of the individual blocks. In addition, an additional field is transmitted in encoded form which defines the number $A_i$ of blocks within this transmission frame. This field, which represents a type of relative address within the image, is the only item of information which must be guaranteed to arrive for every transmission frame, because otherwise the assignment of the blocks in the image is lost. This field is of length $M_i = M$ in bits, in consequence of maximum of $2^M$ blocks can be packed into a transmission frame. The following, therefore, must apply:

$$\sum_{j=J_i}^{J_{i+1}-1} L_j \leq N - M_i = N - M.$$

3. The transmission frame does not necessarily have to be packed full, since the total of the lengths $L_j$ within the frame i may possibly be smaller than N. The remaining bits therefore must be filled up, [Translator's Note: there is an error in the German here, but this must be what is meant] in the most simple case with padding bits. Improved methods, such as encoded transmission of a portion of the differential image which was lost through the quantisation, or similar, are also possible.
4. After step 2, the $A_i$ blocks have now been determined that will be transmitted in frame i. Now the information is ordered in such a manner that the most significant information is located at the beginning of the block and in line with their decreasing significance the data in the encoded blocks are arranged in the frame one after the other. Information in the rear part of the frame cannot be decoded without knowledge of the sequence of information bits in the front portion. A bit error would have catastrophic consequences. In the following steps, the arrangement of the data will now be shown.
5. First, the bit field containing the number of the blocks is written at the beginning of the frame.
6. Then, the not predictively encoded DC of the first block follows, and after that the differentially encoded DCs of the remaining blocks.
7. Then the Huffman encoded ACs follow in such a manner that the first run length and Huffman encoded event from every block is always written first. Then the second event of every block follows, and so on until a block has no more events, which means that the End of Block symbol is reached. At that point, no more events are written onto the bitstream.

This is continued until the last block has been completely written into the frame. The remaining data are filled up with padding bits, with a portion of the encoded quantisation error or with similar information, which can be beneficially used to improve the quality.
8. This frame is passed in its entirety to the transmission level and provided with error protection in the manner already described. No further details will be given at this point about the channel encoding and decoding. The source decoder now receives for every frame a partial frame of length $T_i$, which has been declared as correct by the channel decoder (FIG. 2). The remaining portion of the frame is not used in the source decoding.
9. On the basis of this received portion of the packet, the source decoding is now carried out, with the number of the blocks contained in the frame being decoded first. Then all DCs are decoded and finally the AC events are decoded until the end of the partial block is reached. This end is indicated by the bit location up to which the channel decoder has correctly decoded.

Thus at least the low-frequency coefficients can be decoded. The higher-frequency coefficients which can no longer be decoded are set to a "0" before the inverse DCT. Finally, the blocks are reconstructed by an inverse DCT. The absence of higher spectral portions does not cause too much of a problem, since the eye is less sensitive with the higher-frequency portions. Thus the quality of the decoded image is dependent on the lengths of the partial frames $T_i$, but a basic quality is always achieved. Complete failure is not possible.

Encoding in a different manner, sorting the data in a similar and possibly less complex manner is possible, but is less effective. Additionally, a different encoding leading to the described weighting is conceivable but will not be discussed here.

The method in accordance with the invention can advantageously be used for speech transmission via GSM (Global System for Mobile Communication). GSM is today a worldwide system that is primarily used for speech communication between mobile subscribers. Here, a relatively robustly error-resistant speech encoding and an uneven error protection are used.

For all active subscribers, a frame of 456 bits is provided every 20 ms, in which a protected speech frame is transmitted. However, owing to the special characteristics of the mobile channel a constant fluctuation of the received signal is unavoidable. On the one hand fading effects cause brief interruptions in the signal. On the other hand shading effects and the distance to the transmitting antenna cause major differences in signal level.

The encoding of the transmitted speech frame is identical for every subscriber and at all moments in time, in order to keep complexity and signal traffic at a low level; in other words there is no tuning to the transmission conditions which obtain for each individual subscriber. Thus despite uneven error protection (division into two protected classes, one with and one without error detection, and an unprotected class) there is total failure in the event of deep fading dips, a shading effect, severe interference or long physical distances.

The quality of the speech signal, which is normally objectively assessed using the segmental signal-to-noise ratio $SNR_{SEG}$, is, however, very dependent on where an error occurs in the block. Here, the boundary between good and bad cannot be set at a particular bit location in the speech block of a length of 260 bits: the rule is that the more bits are decoded, the better the quality will be, although the GSM channel encoding system was not designed on the basis of these principles and is therefore not optimal. Thus with a design of the source encoding method in accordance with the principles explained, a further qualitative improvement in the GSM system would be possible.

Particularly suitable for this purpose is an error protection system which for encoding uses a convolutional code with a very large memory and also has a rate profile which decreases from the beginning of the block to the end.

Using a sequential decoder, decoding is possible which permits the position of the first error to be estimated. Here, a portion of the information can be assumed to be correctly decoded, with the size of this portion being dependent on the channel condition at that moment and/or the decoding complexity. In addition, using this decoder signal quality can be made dependent on the decoding complexity. With a small amount of power stored in a battery, decoding of low complexity can still achieve an acceptable quality.

As already mentioned, it would be possible by introducing a new type of speech encoder, making even better utilisation of the described characteristics of the interface, for the quality to be improved further. The most significant data, such as the mode bits, entries from code books in ACELP methods, etc., can be assumed with appropriate design of the channel encoding system to be correct by means of the encoding and decoding described. At the decoder, there is then the possibility of achieving better quality by means of additional complexity (e.g. greater consumption of power).

The method in accordance with the invention can also be advantageously used for video transmission via ATM (Asynchronous Transfer Mode). ATM is used in various applications, for example video telephony, videoconferencing, standard television or High Definition TV.

In order to make optimum use of the bandwidth in ATM networks, statistical multiplexing is used, which means that every application can have a variable bit rate. On average, this achieves a better quality than if all applications had to be transmitted at a constant bit rate. However, if the total of the bit rates is higher than the total bit rate available from the transmission medium, there will be packet losses, since the transmission line will be blocked.

However, it would be a waste of resources to design the system on the basis of the total of the maximum bit rates of every individual application. In such a case, then, on average a very considerable portion of the bit rate available would not be used, namely whenever the applications did not require their maximum bit rate. This portion could, in fact, be used for transmission of information.

However, with the methods described above, an acceptable quality can be decoded despite such cases of blocking of the line. By using a source encoding method with a different weighting for the information subunits and an interleaving method, on average a far higher quality can be achieved. By means of this interleaving, the packet losses are converted into individual erasures (erasure channel).

This channel encoding can, for example, be implemented by means of a code with high memory and a rate profile which decreases within the block. Decoding takes place with a sequential decoder. Because of the generally high data rates, the interleaving does not represent a major constraint with regard to delays. The reception quality can also be improved by means of increased decoding complexity in the sequential decoder.

For other networks which make use of statistical multiplexing or are subject to packet losses, such as, for example, the Internet, similar methods can be used.

The method in accordance with the invention can also be used advantageously for television broadcasting. In this case, the signal is supplied to several receivers located in different places. The receivers thus have differing reception conditions, in other words they encounter a differing signal-to-noise ratio (SNR).

In order to be able to offer good quality even to users in peripheral zones, namely those located a long way from the transmitter, a relatively high portion of channel encoding must be used. For most other users, located nearer to the transmitter, the system is then oversized. While by means of hierarchical encoding in discrete layers (normally two) it is possible to achieve a gradation, a distinction is then made only between discrete classes (normally two).

By means of the method described, in which with this utilisation the error position at the interface between channel decoding and source encoding is dependent on the location of the receiver in question (insofar as the location of the receiver determines the distribution of the probability of the first bit error's occurring at a particular bit location in the frame), in accordance with the invention it is thus possible to achieve a granular gradation as a function of the location. Averaged over all users, an increase in quality then results.

The method in accordance with the invention can also be advantageously used for so-called PCM transmission. PCM transmission is a very simple and very widely distributed source encoding method. With PCM transmission a signal represented by its analogue or digital sample values is quantised with a defined word width; and these quantised sample values are encoded in binary form and then transmitted. Here, the binary encoding is normally selected such that the largest binary number which can be represented with this word width is assigned to the largest quantisation level.

A transmission error at the bit location which has the highest binary significance (Most Significant Bit, MSB) thus results in very large differences in the decoded and transmitted sample value, whereas a bit error at the least significant bit location (LSB) generally results in very small, often negligible, deviations. By means of the structure of the PCM encoding, consequently, a weighting of the encoded data is thus already implicitly present.

Using the method in accordance with the invention, this implicit priority weighting of the data can be utilised. For a given stipulated maximum decoding delay, larger blocks can be formed by combining together several PCM-encoded sample values. The data of these combined blocks are then rearranged in accordance with the weighting of the individual bit locations, such that the MSBs are arranged at the beginning of the block and then the other bits follow from there to the end of the block, in accordance with their decreasing significance. For this block, then a decreasing rate profile, for example in a stepped form, can be designed which guarantees a strong protection for the MSBs and a weaker protection for the LSBs.

For a given channel, this type of encoding guarantees that with a good channel condition all the information can be correctly decoded. For less good transmission conditions, at least correct reception of the more significant bit locations is guaranteed, which in principle is equivalent to guaranteeing quantisation with a lower word width.

This can be achieved, for example, by the use of a sequential decoding algorithm in conjunction with a convolutional code with high memory, which additionally can also supply information about the location of the first decoding error. The application decoder of the application, which is based upon the PCM-encoded data, can make beneficial use of this error location information.

PCM encoding is often used for transmission of measurement signals. The readings are quantised and encoded in binary form in accordance with the known method described above, and then transmitted to evaluation locations. Under such conditions the method in accordance with the invention is also applicable in the large domain of measurement signal transmission. A of the methods mentioned above can be transferred directly and better transmission than with standard methods better transmission is thus possible, even if the PCM-encoded measurement signals have to be transmitted over channels highly subject to interference.

The method in accordance with the invention can also be advantageously used in mobile audio transmission. As an example which falls within this category, in the following the Digital Audio Broadcasting (DAB) system will be considered. As in the case of the applications already described, here too there is a possibility of achieving an increase in quality by applying the method in accordance with the invention.

In applications in the mobile audio sector, in principle the same interference mechanisms have to be combated as lead to distortions of the transmitted information for example, in the GSM system. The dependence of the reception amplitude on the location of the receiver concerned is one contributing factor. Depending on the distance to the transmitter, there is for example a degree of free space attenuation, or effects occur from shading phenomena in the signal transmission path. On the other hand, there is interference from the mobility of the users involved and from other users.

The interference effects can be divided into two groups: those which arise from the differing locations of the receivers, and those which are caused by the mobility over time of the receivers. In order to make reception possible for all receivers, using standard methods, the channel encoding system has to be designed for the receiver with the worst reception conditions. The result is that for receivers with better reception conditions the system is over-designed in its channel encoding (resulting in redundancy).

Using the method in accordance with invention, a channel encoding system can be designed which allows receivers with good reception conditions to decode a maximum amount of information and at the same time permits decoding of basic amounts of information by the receivers with unfavourable reception conditions, without compressing the data rate too much favour of these "bad" receivers.

FIG. 4 shows the procedure in principle for generating a compressed data signal for transmission from a sampled audio time-domain signal, based on psycho-acoustical considerations. For this purpose, the sampled time-domain signal is subjected to a time/frequency-domain transformation, the sample values of which are quantised with a defined word width on the basis of psycho-acoustical considerations.

In a similar way as with PCM transmission, here too an arrangement of the bitstream of the sampling values by significance can take place. In addition, it must also be ensured that certain items of information in the bitstream which are absolutely essential for the decoding, such as, for example, code books, amplification factors, etc., are decoded in a guaranteed correct manner.

This requirement can be met by using the procedure in accordance with the invention. A rate profile matched to the specific requirements of audio applications is designed. For this purpose, once again blocks are formed within which the information that is absolutely essential for decoding is arranged at the beginning of the block and the rest of the block is arranged as a function of significance. On the basis of this arrangement, a rate profile is designed with a rate decreasing from the beginning of the block to the end, and the pattern of this profile ensures that the absolutely essential information can be correctly decoded by all receivers.

Here, advantageous use can be made of a convolutional code with a large memory which is decoded by a sequential algorithm, which under certain circumstances permits location of the first error. This location of the first error offers the possibility of deciding, on the basis of an examination of the quality, whether the remaining bits which have not being correctly decoded should be filled up with systematic bits from the data stream which under certain circumstances may be garbled, with random data or with data from preceding blocks (concealment).

Here, too, the reception quality can be very simply and effectively scaled by means of the decoding complexity of the sequential decoder; for example, if sufficient power is present (for example from a battery) the decoding complexity of the decoder can be set higher, so that the corresponding receiver can decode a better quality. The characteristics of radio broadcasting are appropriate for the use of the method in accordance with the invention precisely because the delay which results, for example, from formation of the blocks, is not an impediment for the reception of audio data in radio broadcasting.

For the case of the application in the area of mobile audio, similarly as with the sample applications described, a further increase in the effectiveness of the method in accordance with the invention can be achieved by tuning of the corresponding source encoding method, with the characteristics of the new interface as regards error location being better utilised.

The method in accordance with the invention can also be advantageously utilised in the case of audio broadcasting over the Internet. This area has recently become much more significant, as radio programmes have started to be broadcast over the Internet. One example is the Real Audio Player, which allows reception of numerous radio programmes over the Internet.

In a similar manner as was described earlier in the case of mobile audio, here too compression of the audio signal is achieved by the application of generic speech encoding algorithms. FIG. 5 shows the principles of this procedure. The sampled audio time-domain signal is subjected to a time/frequency-domain transformation and the quantisation of the sample values from the frequency domain is once again controlled on the basis of psycho-acoustical considerations.

In order to achieve a further compression, a further encoding procedure is then utilised, for example in the form of an entropy encoding, such as Huffman coding, which can be used to give further compression. The encoding used, however, is often very susceptible to error propagation, which means that decoding errors generally cause the remaining data to be unusable or else results in very severely reduced quality owing to erroneous interpretations. Here, too, it is possible to use the method in accordance with the invention advantageously, since error location can help in avoiding the effects referred to.

The "Internet channel" is distinctly different from the mobile radio channels referred to above or the air interface, since the data transmission generally takes place over very reliable media, such as, for example, glass-fibre wires, and thus takes place virtually without errors. The system is thus constrained not by the occurrence of bit errors, but by the probability of packet losses. Packet losses occur whenever the total of the transmission rate called for by the applications exceeds the network capacity, and as a result the buffers provided by the system overflow or the maximum permissible delay is exceeded.

In a similar manner to video transmission via ATM, with the Internet, too, reference may be made to statistical multiplexing. Many applications share the physical transmission medium and the same data rate is used for all applications. If there is no more capacity, blockages occur. The consequence is that the data to be transmitted have to be buffered and transmitted along other routes.

In this scenario, packet losses may occur in two different ways. On the one hand, buffers may overflow and then the data are simply lost. On the other hand, every application has a maximum delay time, and if this delay is exceeded, decoding of the data already received begins. Packets arriving after this time can no longer be taken into account and therefore have to be treated in the same way as lost packets.

By advantageous application of the method in accordance with the invention these packet losses can be treated in the following manner: by means of a suitably designed interleaving process the packet losses are converted into statistically independent individual erasures. An erasure means that the application decoder is aware that a data bit is missing from a location, but is unaware what value was transmitted at that location. The result of the interleaving, therefore, is the conversion of the Internet channel with packet losses into a binary erasure channel, at least to some extent.

By means of the advantageous application of a rate profile decreasing from the beginning to the end of the block, it is then possible to achieve a weighted error protection, in which a convolutional code with large memory can be used in conjunction with sequential decoding, with this convolutional code permitting location of the first decoding error in the block. This information is very important since the process shown in FIG. 5 with optional source encoding frequently results in error propagation, leading to significant dips in quality in the decoded signal.

What is claimed is:

1. A method of transmitting encoded digital signals and decoding the digital signals at a receiver, said method comprising the steps of:

source encoding the digital signals into a plurality of subunits of source encoded digital signals;

assigning, to each subunit, one of a plurality of differing levels of significance;

ordering, in a data frame, said subunits in a hierarchical manner in accordance with the level of significance assigned to each of the subunits;

channel encoding the subunits of source encoded digital signals utilizing a variable rate code, wherein the rate of the code increases for increasing levels of significance assigned to the hierarchically ordered subunits in the data frame;

transmitting the channel encoded subunits to the receiver;

correctly channel decoding, utilizing a decoding method at the receiver, a subset of said subunits to produce a correct portion of decoded data, said correct portion being defined by a position of a first error in the data frame, wherein the position of the first error in the data frame is dependent upon at least one of the encoding rate, channel quality, and decoding complexity;

determining the correct portion of decoded data based on characteristics of the decoding method; and reconstructing the digital signals using only the correct portion of decoded data.

2. The method of claim 1, wherein said ordering step comprises the additional step of arranging the subunits in order of decreasing significance, starting with the most significant subunit.

3. The method of claim 2, wherein the code rate increases along a length of the data frame up to a maximum that is equal to or less than unity.

4. The method of claim 2, wherein rate-compatible codes are employed in said channel encoding step such that the code rate increases along a length of the data frame up to a maximum that is equal to or less than unity.

5. The method of claim 1, wherein variable length codes are employed in said source encoding.

6. The method of claim 1, wherein interpretation of one of said subunits is dependent on a correctness of another of said subunits, the dependent subunit being arranged further towards an end of the data frame.

7. The method of claim 1, wherein said ordering step comprises arranging the subunits in order of decreasing significance both from a start and from an end of the data frame towards a middle of the data frame.

8. The method of claim 7, wherein a robustly error-resistant mode of MPEG-4 video coding is employed on a portion of the data frame.

9. The method of claim 7, wherein interpretation of one of said subunits is dependent on a correctness of another of said subunits, the dependent subunit being arranged further towards the middle of the data frame.

10. The method in accordance with claim 7, wherein variable redundancy codes are employed in said channel encoding, and a code rate of said variable redundancy codes increases from the start and end of the data frame towards the middle of the data frame up to a maximum that is equal to or less than unity and wherein the encoded data frame is decoded by simultaneous decoding, or is decoded by sequential decoding from the start and end of the data frame.

11. The method in accordance with claim 7, wherein rate-compatible codes are employed in said channel encoding, and a code rate of which increases from the start and end of the data frame towards the middle of the data frame up to a maximum that is equal to or less than unity and wherein the encoded data frame is decoded by simultaneous decoding, or is decoded by sequential decoding from the start and end of the data frame.

12. The method of claim 1, further comprising the steps of:
  employing an adaptive sequential decoding of a given complexity combined with a convolutional code and a large memory;
  decoding to a certain frame depth; and
  reconstructing the decoded portion of the original digital signals from the frames decoded in said decoding to said certain frame depth step, wherein the reconstructed portion of the original digital signals are assumed to be flawless.

13. The method of claim 12, wherein the flawless reconstructed portion of the original digital signals is determined by at least one of:
  a point where a decoder stopped;
  a change in metrics;
  a consumed decoding resource; and
  a change in the decoding resource.

14. The method of claim 1, wherein said decoding step further comprises:
  working with a stack algorithm by a decoder; and
  determining a location of the first error by using a content of the stack.

15. The method of claim 14, comprising the additional step of generating reliability information on each decoded subunit from the content of the stack.

16. The method of claim 14, comprising the additional step of generating reliability information on each sub-path of a decoded path from characteristics of a sequential decoding algorithm.

17. The method in accordance with claim 14, comprising the additional step of determining the position of the first error by detecting at least one of a point where a decoder stopped, a change in metrics, a consumed decoding resource, and a change in the decoding resource.

18. The method of claim 1, wherein at least one of source-controlled channel encoding, channel decoding, and iterative decoding are employed in said channel encoding and decoding steps.

19. The method of claim 1, comprising the additional step of converting a channel with packet losses by means of an interleaving process into an erasure channel.

20. The method of claim 1, wherein said data frame comprises a transmission of at least one of digital speech, text, sound, image, video, and measurement signals.

21. The method of claim 20, wherein said data frame comprises JPEG-encoded still images.

22. The method of claim 20, wherein said data frame comprises a speech transmission transmitted via Global System for Mobile Communication (GSM).

23. The method of claim 20, wherein said data frame comprises a video transmission transmitted via Asynchronous Transfer Mode (ATM).

24. The method of claim 20, wherein said data frame uses the Internet packet transmission protocol (IP), with packets which arrive late or do not arrive being converted by use of an appropriate interleaving process into erasures.

25. The method of claim 20, wherein said data frame is used in television broadcasting.

26. The method of claim 20, wherein said data frame comprises a PCM transmission of data.

27. The method of claim 20, wherein said data frame comprises a mobile audio transmission.

28. The method of claim 20, wherein said data frame is used in audio broadcasting via the Internet, in which packets which arrive late or do not arrive are erased by means of an interleaving process.

29. The method of claim 20, further comprising transmitting the source encoded digital signals by means of a storage of these signals, with a storage medium involved, constituting the channel.

* * * * *